(12) United States Patent
Dong et al.

(10) Patent No.: US 8,472,257 B2
(45) Date of Patent: Jun. 25, 2013

(54) NONVOLATILE MEMORY AND METHOD FOR IMPROVED PROGRAMMING WITH REDUCED VERIFY

(75) Inventors: Yingda Dong, San Jose, CA (US); Ken Oowada, Fujisawa (JP); Cynthia Hsu, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 278 days.

(21) Appl. No.: 13/071,170

(22) Filed: Mar. 24, 2011

(65) Prior Publication Data

US 2012/0243323 A1    Sep. 27, 2012

(51) Int. Cl.
*G11C 16/10* (2006.01)
(52) U.S. Cl.
USPC .................................... 365/185.19
(58) Field of Classification Search
USPC .................................... 365/185.19
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,287 A | 1/2000 | Itoh et al. |
| 6,046,935 A | 4/2000 | Takeuchi et al. |
| 6,222,762 B1 | 4/2001 | Guterman et al. |
| 7,349,261 B2 * | 3/2008 | Mokhlesi ................. 365/185.18 |
| 7,447,081 B2 * | 11/2008 | Chan ........................ 365/185.22 |

(Continued)

OTHER PUBLICATIONS

Notification of Transmittal of the Internationa Search Report and the Written Opinion of the International Searching Authority, or the Declaration for International Application No. PCT/US2012/027471 mailed May 22, 2012, 10. pages.

(Continued)

*Primary Examiner* — Hoai V Ho
*Assistant Examiner* — Tri Hoang
(74) *Attorney, Agent, or Firm* — Davis Wright Tremaine LLP

(57) ABSTRACT

A group of memory cells of a nonvolatile memory is programmed in parallel in a programming pass with a minimum of verify steps from an erased state to respective target states by a staircase waveform. The memory states are demarcated by a set of increasing demarcation threshold values ($V_1, \ldots, V_N$). Initially in the programming pass, the memory cells are verified relative to a test reference threshold value. This test reference threshold has a value offset past a designate demarcation threshold value $V_i$ among the set by a predetermined margin. The overshoot of each memory cell when programmed past $V_i$, to be more or less than the margin can be determined. Accordingly, memory cells found to have an overshoot more than the margin are counteracted by having their programming rate slowed down in a subsequent portion of the programming pass so as to maintain a tighter threshold distribution.

20 Claims, 14 Drawing Sheets

U.S. PATENT DOCUMENTS

| | | |
|---|---|---|
| 7,643,348 B2 | 1/2010 | Cernea |
| 7,656,710 B1 * | 2/2010 | Wong ........................ 365/185.19 |
| 7,800,945 B2 | 9/2010 | Cernea |
| 7,826,271 B2 | 11/2010 | Cernea |
| 2005/0157555 A1 | 7/2005 | Ono |
| 2006/0104120 A1 | 5/2006 | Hemink |
| 2010/0226164 A1 | 9/2010 | Nagashima |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

Conventional Programming with alternating Progam/Verify sequence for a 4-state memory Example of programming a 4-state memory using 3 verify levels

| Bits/cell | # of States = Ns | Est. # of Program pulses = Np ~ Ns | Est. # of Program pulse train passes | # of states sensed in each verify = Vs | Est. # of Verify Cycles = Nv = k*Np*Vs |
|---|---|---|---|---|---|
| 1 | 2 | 2 | k | 1 | k*2 |
| 2 | 4 | 4 | k | 3 | k*12 |
| 3 | 8 | 8 | k | 7 | k*56 |
| 4 | 16 | 16 | k | 15 | k*240 |
| ... | ... | ... | ... | ... | ... |
| N | $2^N$ | $2^N$ | k | $2^N - 1$ | ~$k*2^{2N}$ |

(k ~ 1 to 4)

Estimated number of program pulses and verify cycles to program a page using conventional alternating program/verify algorithm

FIG. 10

Example of Threshold Distribution Boardening for higher programmed states with one initial verify during programming Example of Distribution Tightening for higher programmed states by slowing down the programming rate of overshot bits according to a first embodiment Example of Distribution Tightening for higher programmed states by slowing down the programming rate of overshot bits according to a second embodiment

NONVOLATILE MEMORY AND METHOD FOR IMPROVED PROGRAMMING WITH REDUCED VERIFY

FIELD OF THE INVENTION

This invention relates generally to non-volatile semiconductor memory such as electrically erasable programmable read-only memory (EEPROM) and flash EEPROM, and specifically to memory and programming operations in which a tight threshold voltage distribution is maintained even with a reduced number of program-verify operations.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate. The process appears highly non-linear and hence a trial-and-error approach is employed.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify cycle may incur up to 16 sensing operations. Thus, with increasing number of distinguishable state levels in multi-level memory cells ("MLC"), the verify cycle of the program/verify scheme becomes increasingly time-consuming.

In particular, the conventional programming requires a verify operation in between every pulse. When the memory is partitioned into many memory states, the verify operation must check many states in between every pulse. The number of verify operations increases with the square of the number of state partitions. Thus, for memory that hold 3 or more bits of data per cell, the number of verify operations become prohibitively large.

Reduced verify schemes for programming a nonvolatile memory have been disclosed in U.S. Pat. Nos. 7,643,348, 7,800,945 and 7,826,271. These schemes involve programming with a staircase waveform pulse by pulse and initially verifying between pulses for a cell relative to a checkpoint threshold value. Once the cell has programmed past the checkpoint, the programming continues without verifying and stops when the staircase waveform has reached a certain magnitude given as a predetermined function of the threshold increment from the checkpoint to the cell's target state.

However, as the threshold of a cell under programming is advanced pulse by pulse to its target destination, reducing the number of verifying steps along the way means there is less control in the localization of the threshold at the target destination. This will result in a broadening of the threshold distribution as compared to having more verifying steps in between.

To improve programming resolution, a conventional method is to make the programming pulse step size finer. However, this has the effect of proportionally increasing the number of pulses require to program thereby increasing programming time. Furthermore, the increase in the number of programming pulses will compound to a corresponding increase in the number of interleaving verifications in conventional methods.

Therefore there is a general need for high capacity and high performance non-volatile memory. In particular, there is a need to have a high capacity nonvolatile memory with improved programming performance where the aforementioned disadvantage is minimized and where verifying and broadening of the threshold distribution are minimized at the same time.

SUMMARY OF INVENTION

Programming with Tighter Threshold Distribution

A group of memory cells of a nonvolatile memory is programmed in parallel in a programming pass from an erased state to respective target states by a series of pulses of a staircase waveform. Conventionally, following each pulse, the memory cells are sensed relative to a verify threshold value. Whenever a cell is detected to change from a turned-on to a turned-off state, it is an indication that the cell's threshold has programmed past the verify threshold value. The cell is considered programmed relative to the verify threshold value and programming for that cell is inhibited from then on. However, the amount of overshoot of the cell's threshold beyond the verify threshold value is unknown. In general the overshoot is a function of the cell's threshold relative position to the verify threshold value before the programming pulse and the strength or step size of the pulse. If a verify operation takes place after each pulse, the overshoot is kept in check. However, in programming schemes where verify operations are reduced or eliminated, and the cell's threshold may be advanced over multiple pulses without any intervening verify, the overshoot may compound, resulting in a widening of the programmed threshold distribution for the more programmed states.

According to a general embodiment of the invention, a group of memory cells of a nonvolatile memory is programmed in parallel in a programming pass from an erased state to respective target states by a staircase waveform. The memory cells each support a threshold window partitioned into a plurality of threshold subranges by a set of increasing demarcation threshold values ($V_1, \ldots, V_N$) so that each subrange represents a different memory state. During the initial stage of the programming pass, the memory cells are verified relative to a test reference threshold value. This test reference threshold has a value offset from a designate demarcation threshold value $V_i$ among the set by a predetermined margin. This provides a measure of the overshoot of each memory cell when programmed past $V_i$, i.e., whether the overshoot is more or less than the margin. Accordingly, memory cells found to have overshot more than the margin would end up with a threshold distribution at least as wide as the margin. Memory cells with this excessive overshoot are counteracted by having their programming rate slowed down in subsequent portion of the programming pass. The slowed down in programming rate will trim the far end of the threshold distribution as the cell is being programmed to higher programmed states. In this way, the memory cells will be programmed to individual memory states having relatively tighter threshold distributions, even if the subsequent portion of the programming pass is performed with little or no verifying in between programming pulses.

In a preferred embodiment the predetermined margin is halfway the width of the threshold subrange containing the test reference threshold value.

In one embodiment, a word line is provided to access in parallel the group of memory cells so that programming to the group is effected by applying the programming voltage to the word line. Also respective bit lines are provided to access individual memory cells of the group, and any memory cell that needs to have its programming rate reduced can be accomplished by raising by a predetermined voltage on a respective bit line of said any memory cell during said programming.

In a preferred embodiment, the initial portion of the programming pass, after each program pulse, the memory cells are verified relative to a checkpoint threshold value which preferably is chosen as one of the demarcation threshold values Vj (j=1 or 2 or 3 . . . ). Preferably the checkpoint threshold value is chosen to be $V_1$. This establishes a baseline programming voltage level for programming cells with higher target states without the need for further verify steps. In the subsequent portion of the programming pass, a predetermined number of additional program pulses from the identified program pulse is applied to respective memory cells of the group under programming to program the respective memory cells to respective target states, the predetermined number additional program pulses being a function of the identified program pulse and the respective target state.

The advantage of the present invention is that a nonvolatile memory can be programmed with a tighter threshold distribution even in high performance programming scheme in which verify operation is reduced.

Additional features and advantages of the present invention will be understood from the following description of its preferred embodiments, which description should be taken in conjunction with the accompanying drawings.

BRIEF DESCRIPTION OF THE DRAWINGS

FIG. 10 is a table illustrating estimated numbers of programming pulses and verifying cycles to program a page using conventional alternating program/verify algorithm.

DETAILED DESCRIPTION OF THE PREFERRED EMBODIMENTS

Memory System

FIG. 1 to FIG. 7 illustrate example memory systems in which the various aspects of the present invention may be implemented.

FIG. 8 to FIG. 11 illustrate examples of conventional programming techniques.

Figure 12:
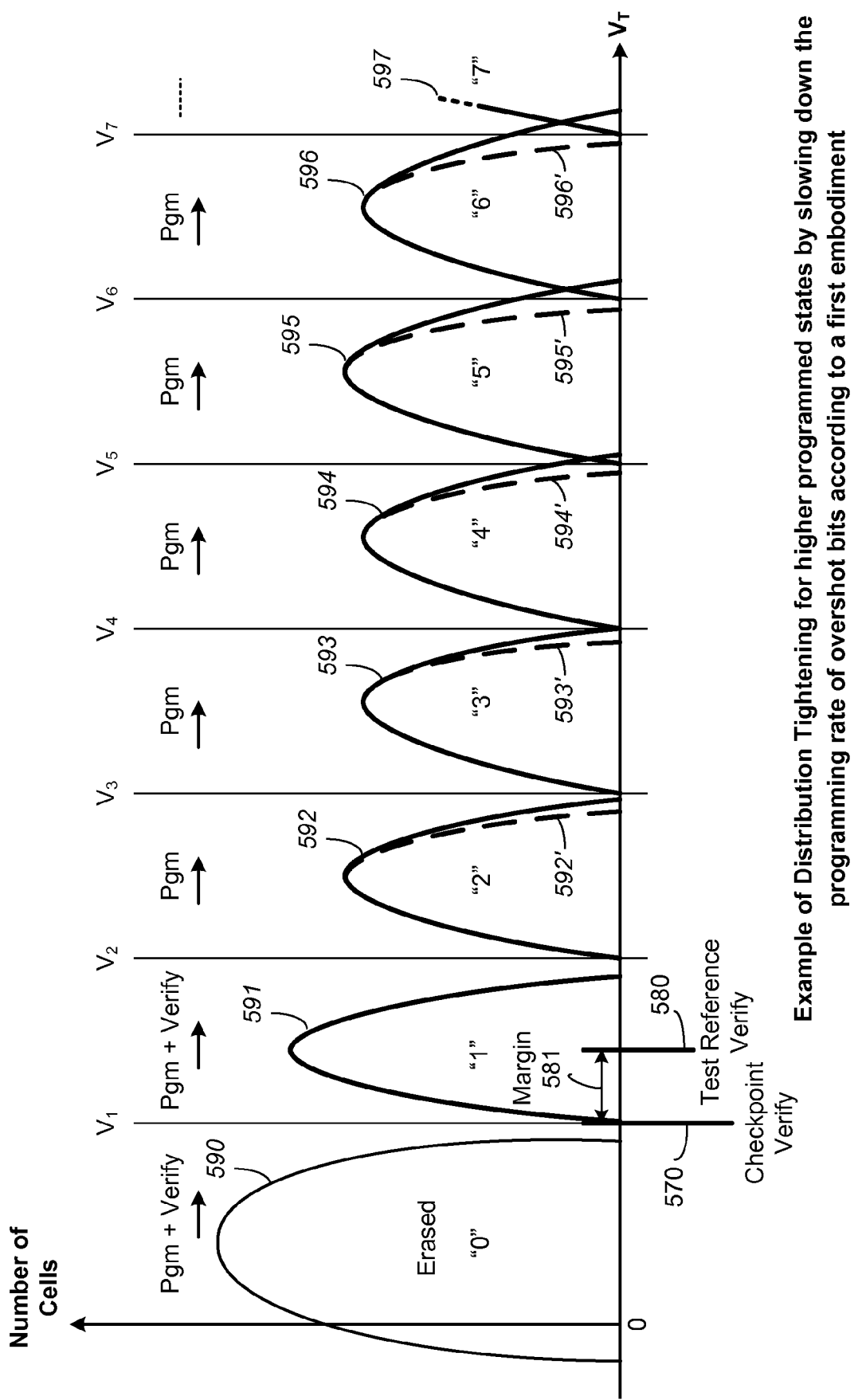
FIG. 12 is a threshold distribution of an 8-state memory obtained by programming and verifying relative to a test reference threshold value, according to one embodiment of the present invention.
Figure 13:
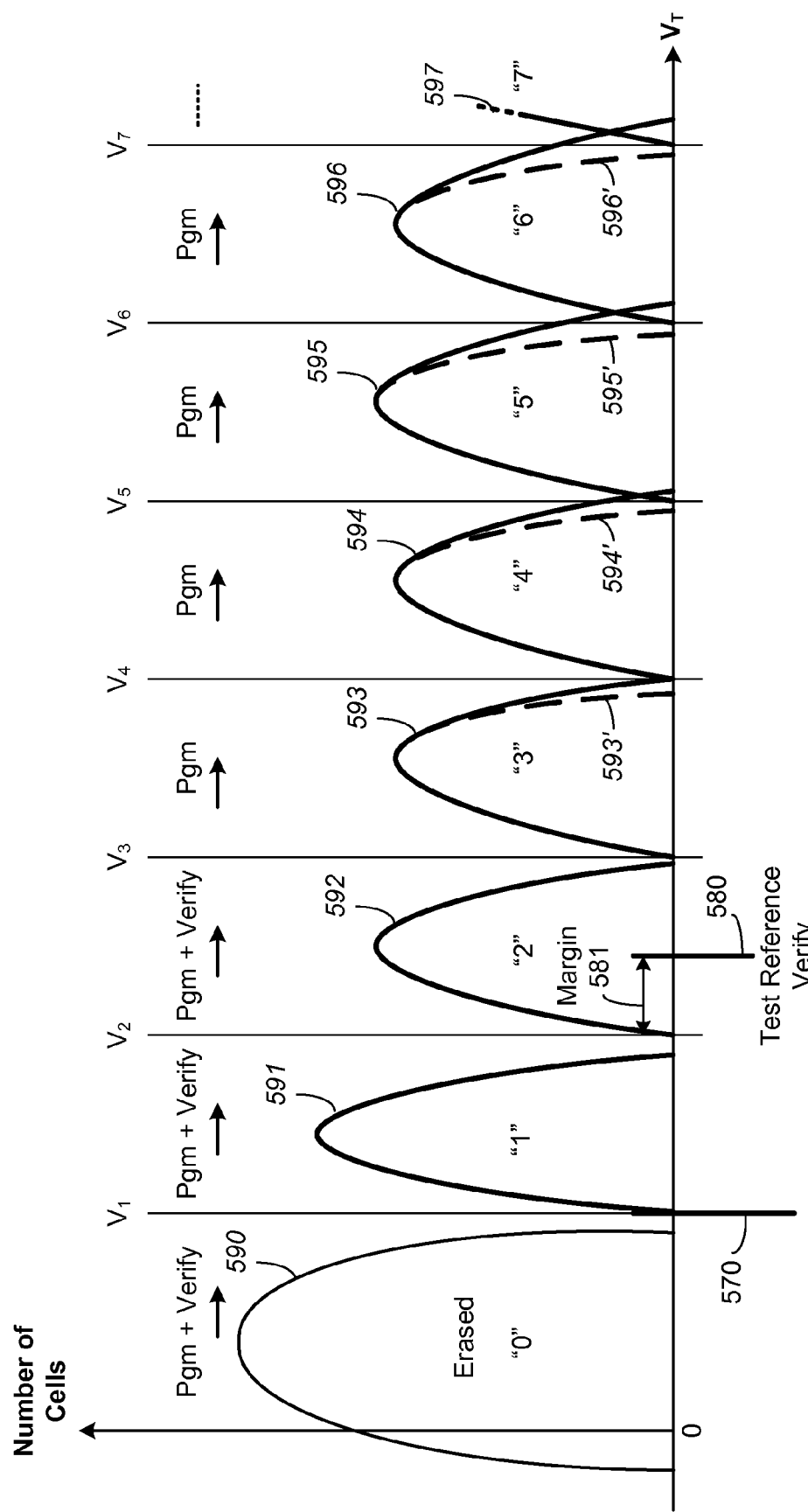
FIG. 13 is a threshold distribution of an 8-state memory obtained by programming and verifying relative to a test reference threshold according to another embodiment of the present invention.
Figure 14:
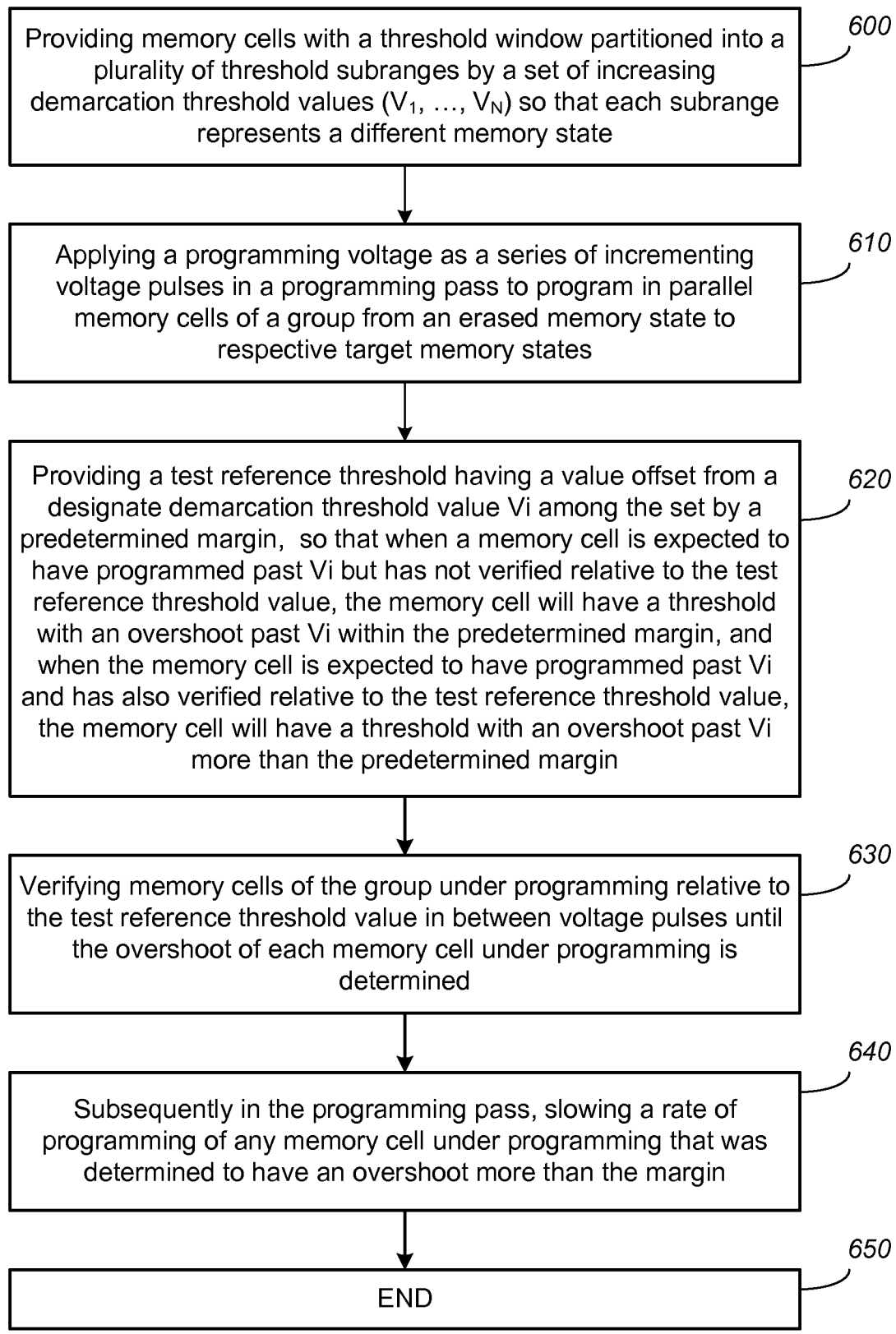
FIG. 14 is a flow diagram illustrating setting a programming voltage with step size such that each additional pulse will program a memory cell to the next memory state.

FIG. 12 to FIG. 14 illustrate the various aspects and embodiments of the present invention.

Figure 1:
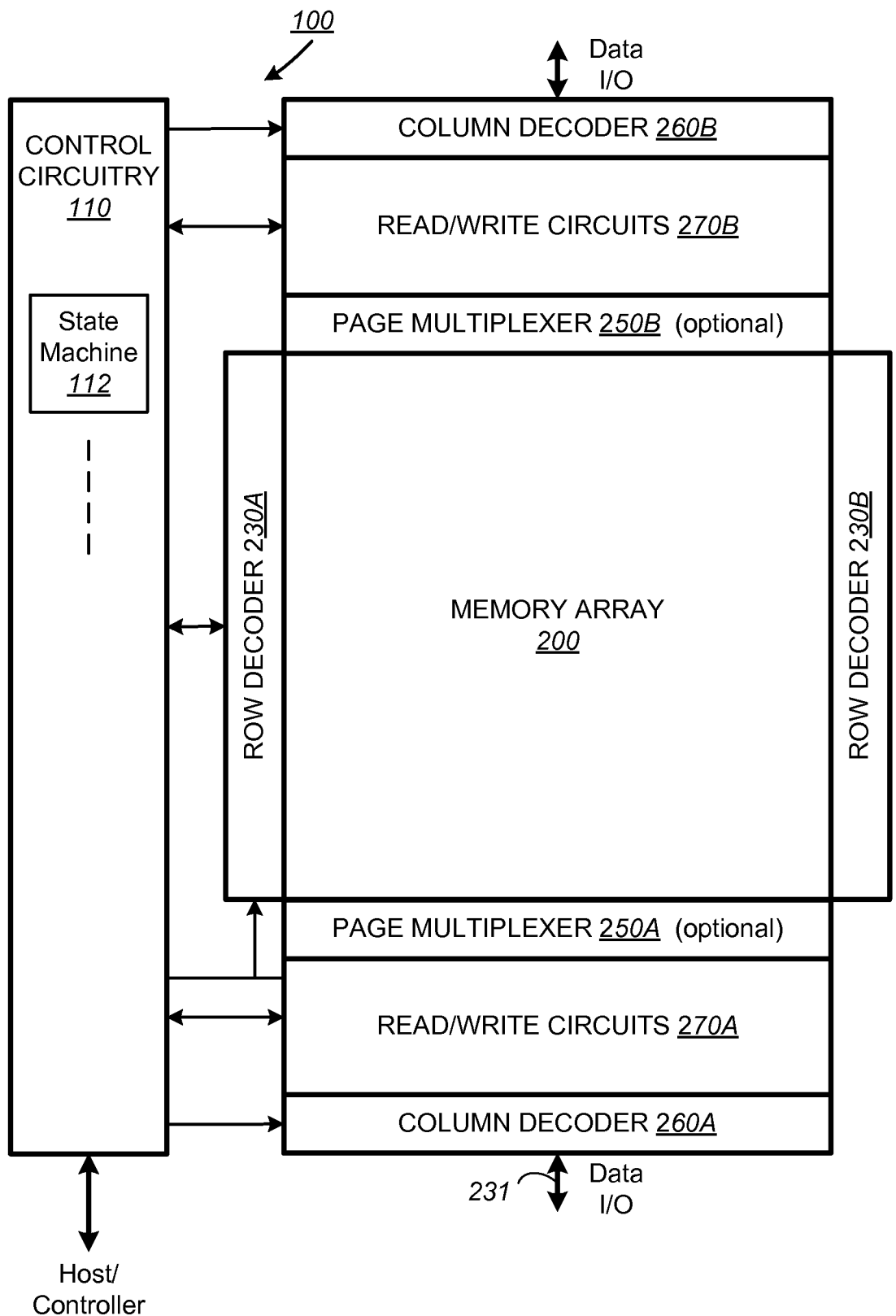
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
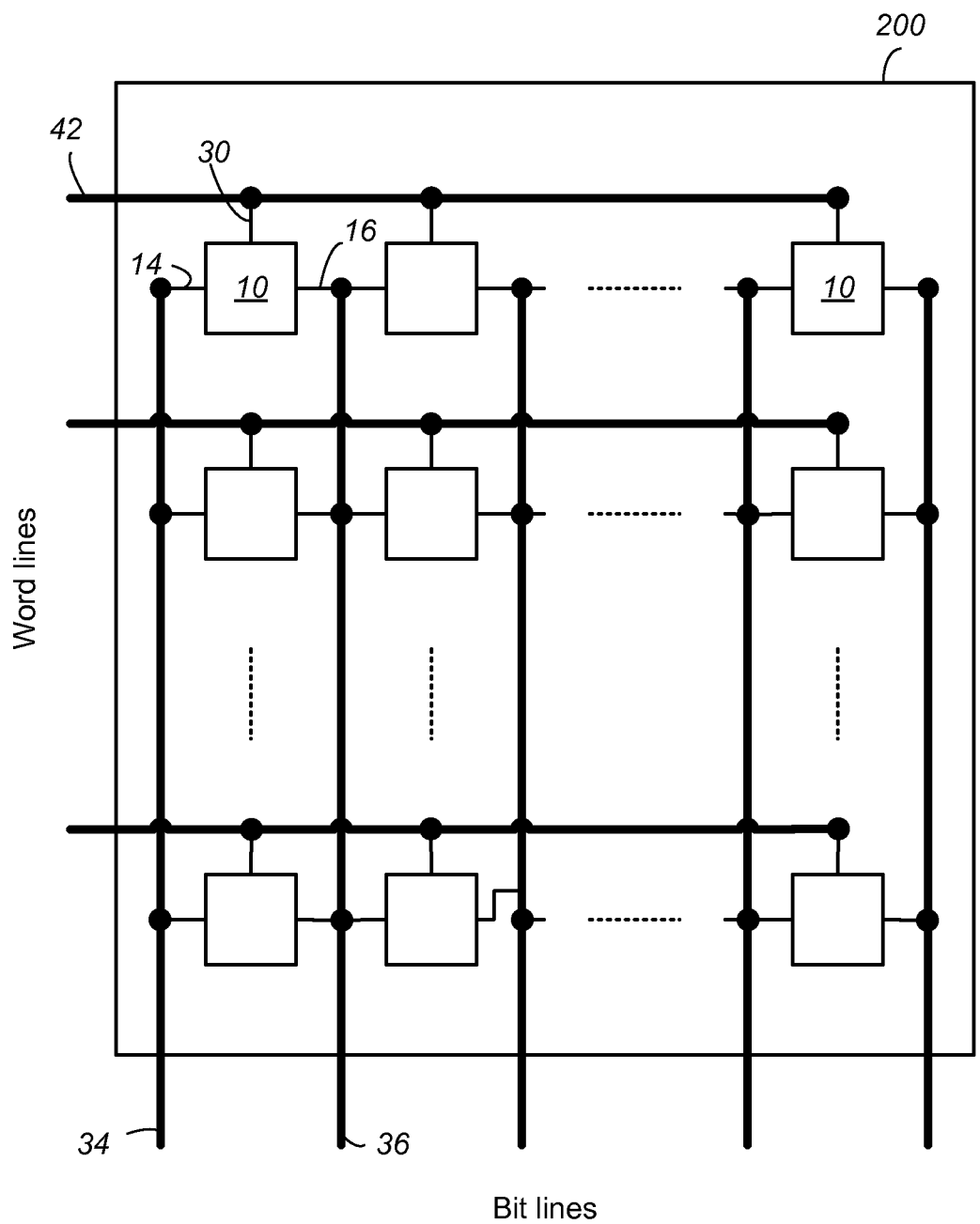
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
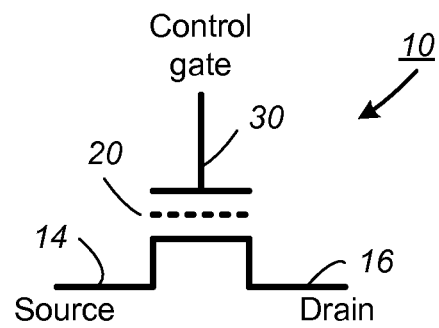
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
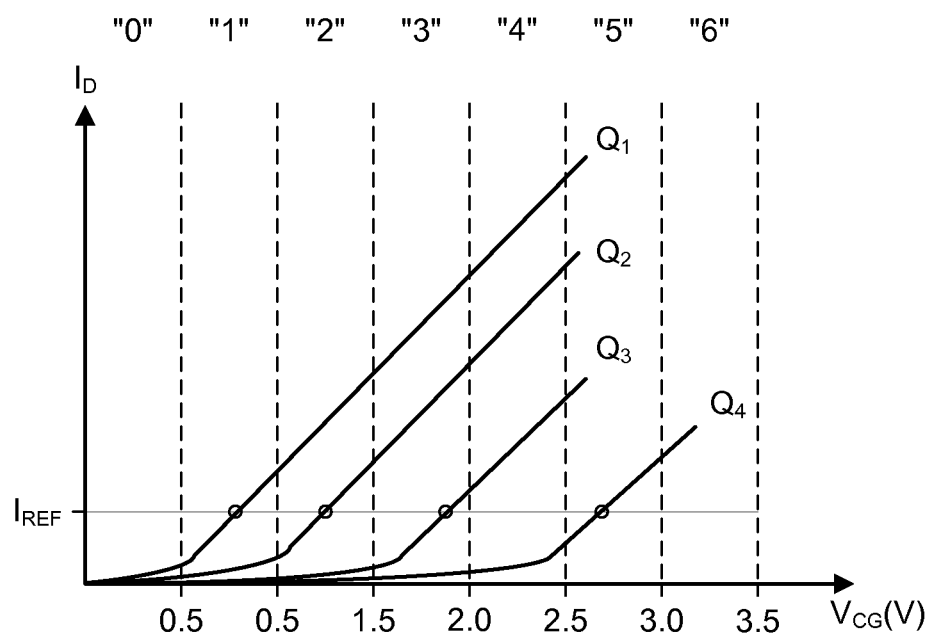
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from -1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
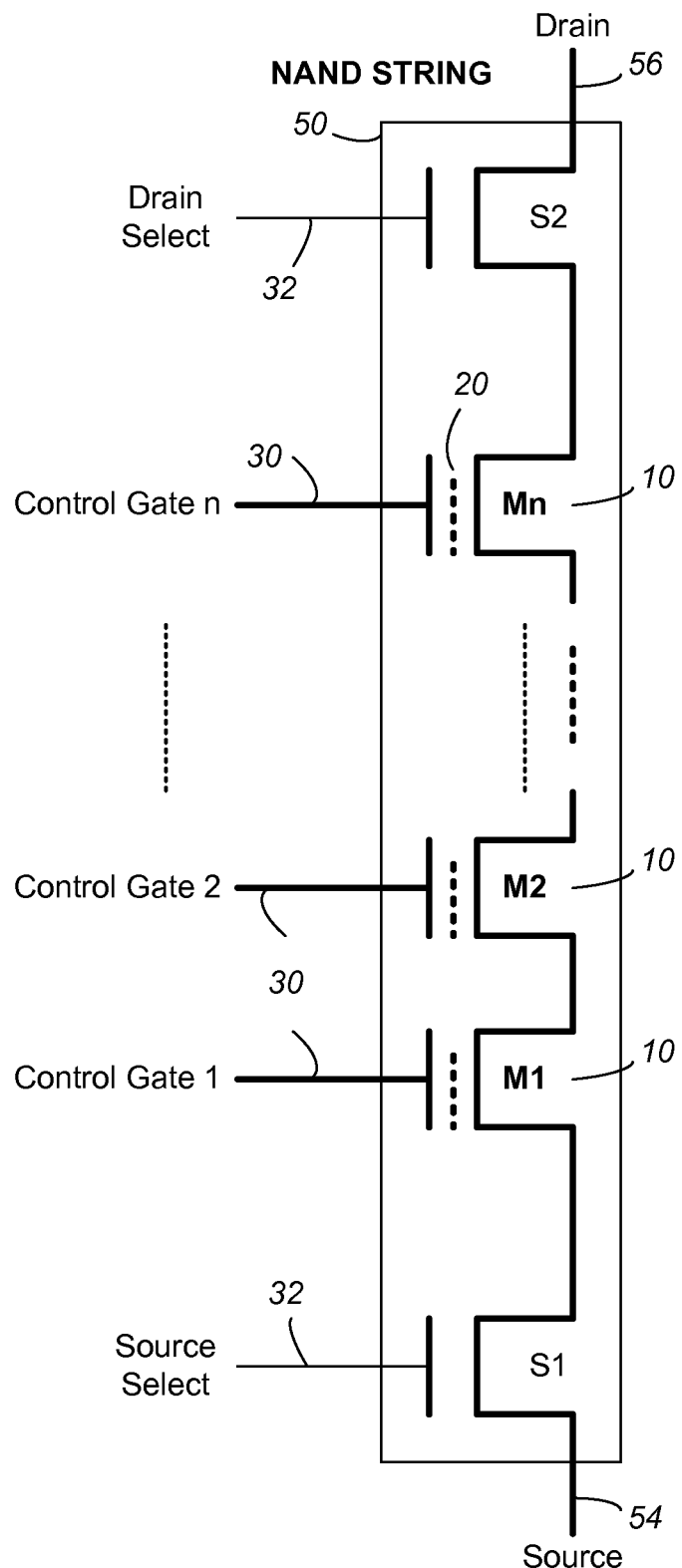
FIG. 5A illustrates schematically a string of memory cells organized into an NAND string.

FIG. 5A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
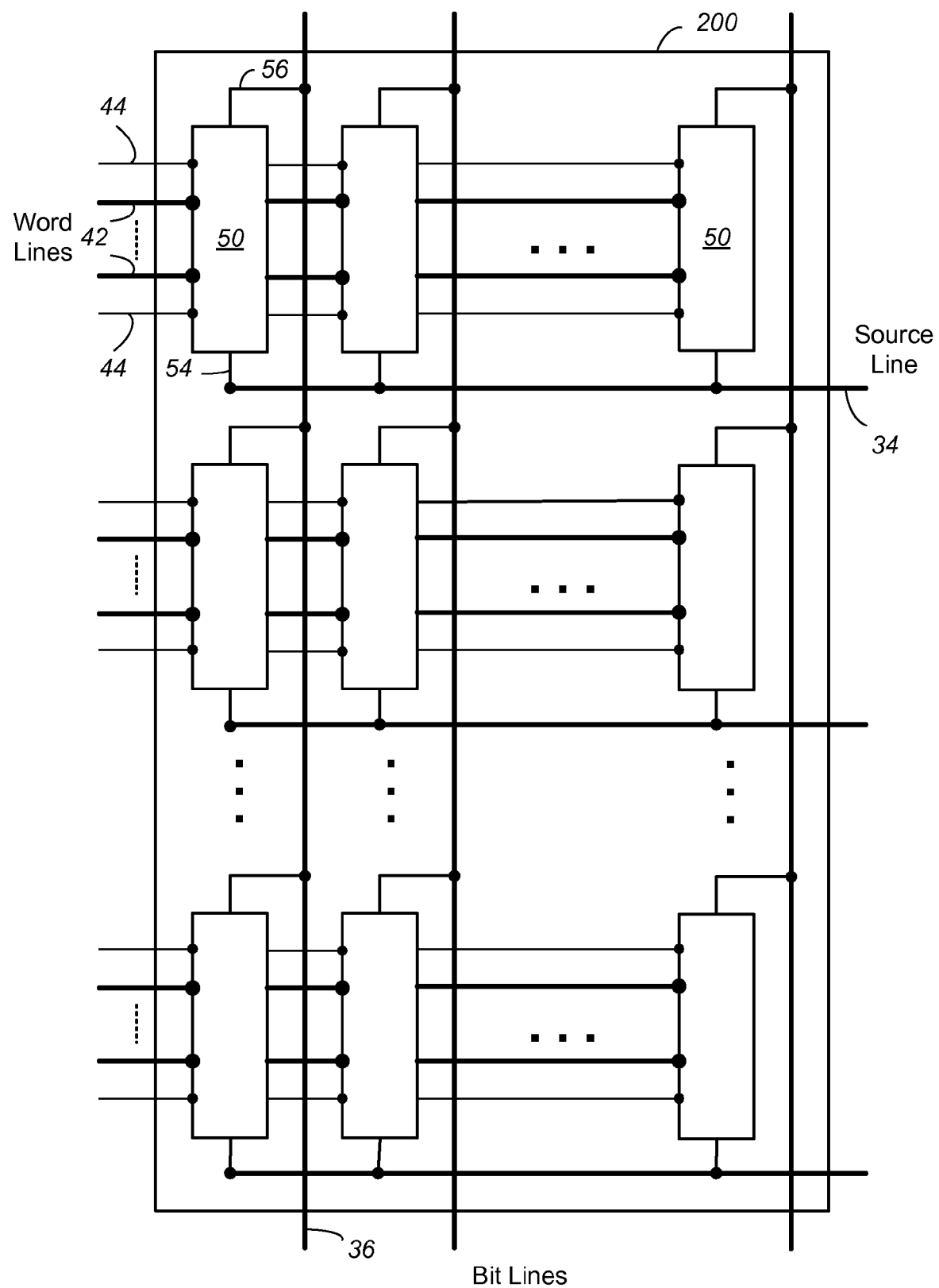
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
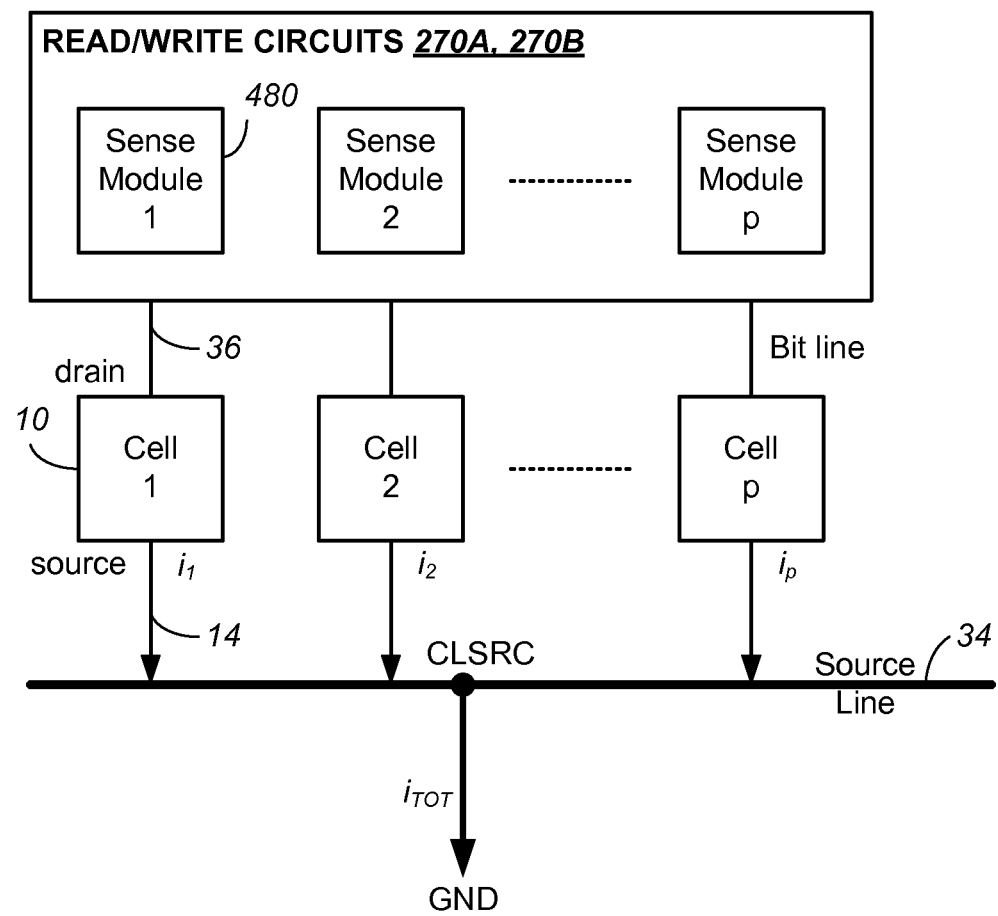
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Page or Word-Line Programming and Verify

Figure 7:
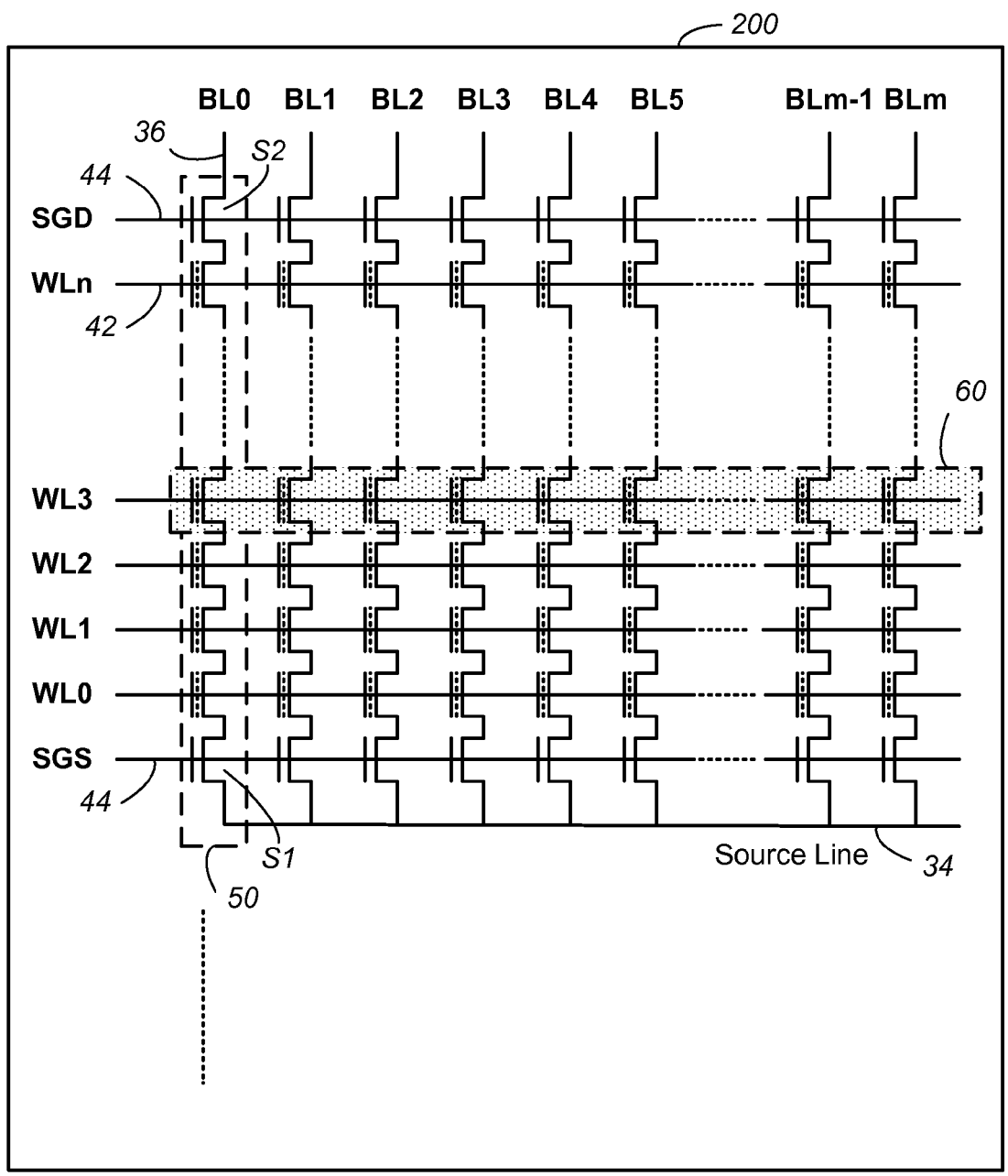
FIG. 7 illustrates a page of memory cells organized, for example in the NAND configuration, being programmed in parallel.

FIG. 7 illustrates a page of memory cells organized, for example in the NAND configuration, being programmed in parallel. FIG. 7 essentially shows a bank of NAND chains 50 from the memory array 200 of FIG. 5B, where the detail of each NAND chain is shown explicitly as in FIG. 5A. A "page" such as the page 60, is a group of memory cells programmable in parallel, made possible by the control gates of the cells connected in common to a word line 42 and each cell accessible by a sensing circuit (e.g., sense module 480 shown in FIG. 6) accessible via a bit line 36. As an example, when programming the page of cells 60, a programming voltage is applied to the common word line WL3. Prior to programming, those cells that have already been programmed to their target states are programmed inhibited. This is accomplished by effectively reducing the voltage difference between the control gate and the channel region of the cell in order to discourage electrons from tunneling from the source to the floating gate (see FIG. 2.)

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Figure 8:
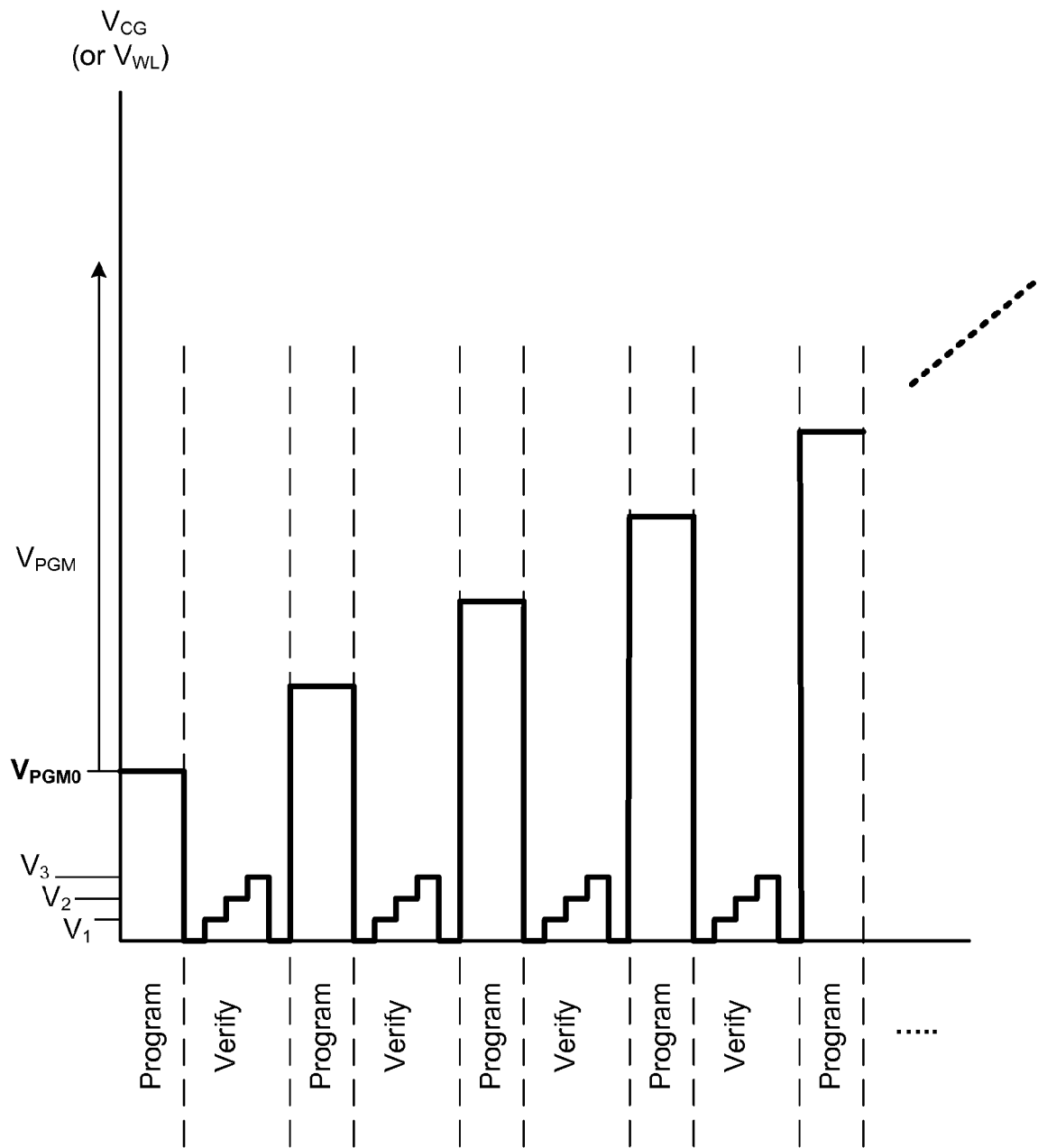
FIG. 8 illustrates a conventional technique for programming a 4-state memory cell to a target memory state.

FIG. 8 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified. One method of program-inhibiting a memory cell is to raise its bit line voltage from 0V to VCC during programming. In this way, even when the cell's control gate has a programming voltage on it, the effective programming voltage on the floating gate is reduced by VCC, thereby inhibiting further programming of the cell.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate.

Figure 9:
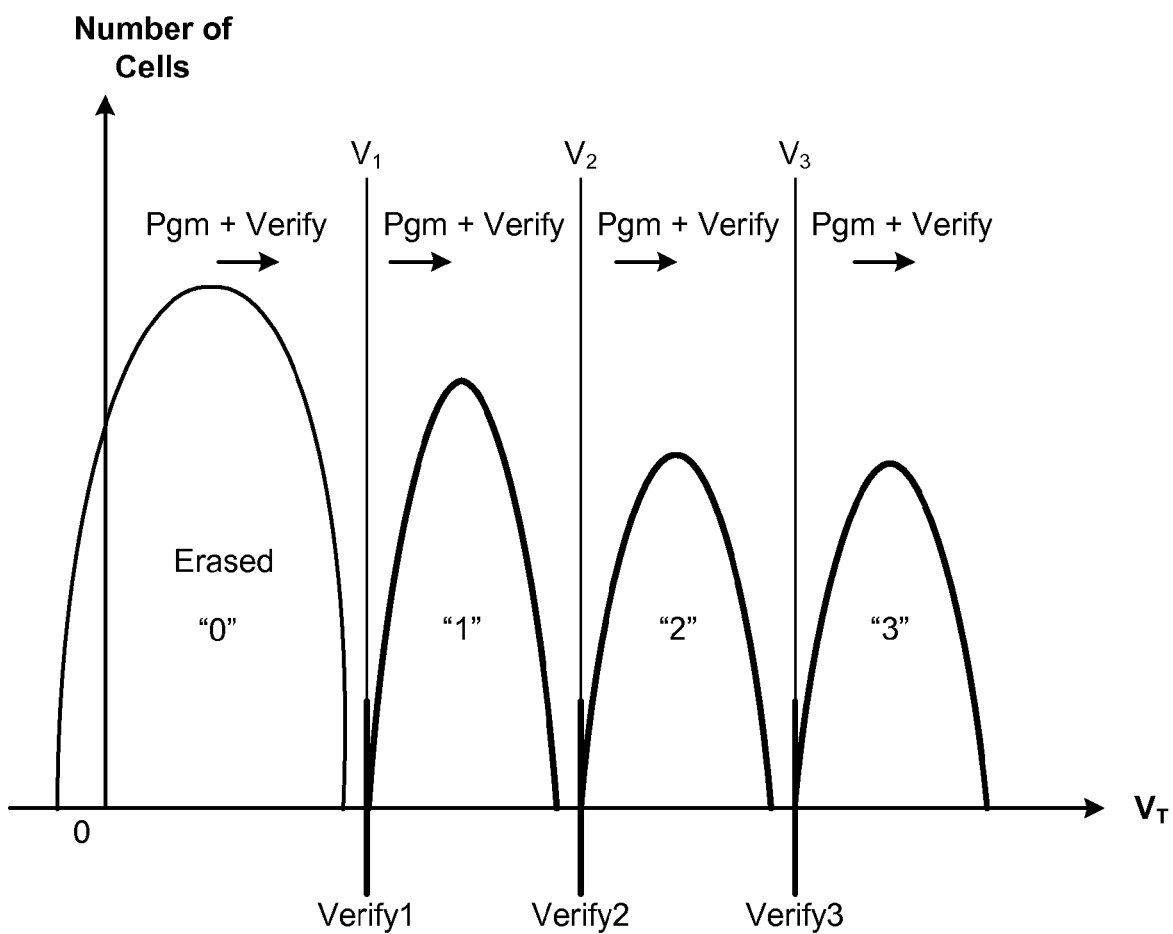
FIG. 9 illustrates schematically the threshold distribution for a 4-state memory after a population of memory cells has been programmed and verified relative to three verify levels by the programming voltage of FIG. 8.

FIG. 9 illustrates schematically the threshold distribution for a 4-state memory after a population of memory cells has been programmed and verified relative to three verify levels by the programming voltage of FIG. 8. Each memory cell can be programmed to a threshold within a range spanned by a threshold window. In the 4-state case, the threshold window is demarcated into 4 subranges by demarcation threshold values $V_1$, $V_2$, $V_3$. The three verify levels are: Verify1=$V_1$, Verify2=$V_2$ and Verify3=$V_3$.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify step would incur at least 16 sensing operations. In some other schemes it could even be a few times more. Thus, with the partitioning of a memory into increasing number of states, the verify cycle of the program/verify scheme becomes increasingly time-consuming.

FIG. 10 is a table illustrating estimated numbers of programming pulses and verifying cycles to program a page using conventional alternating program/verify algorithm. For example, for an N-bit memory, the partitioning is into $Ns=2^N$ states. The number of program pulses is at least the same of the number of states Ns. Some algorithm may require k programming passes, where k may be 1 to 4.) For multi-state memory, each verify operation is further multiplied by $2^N-1$, one for each programmed state. Thus, the estimated number of verified is proportional to $2^{2N}$, which is the square of the number of states. As can be seen from the table, for a 3-bit cell, the nominal number of verify cycles is already extremely high, and that is not including additional sensing required in other schemes. For 4-bit cell, the number of verify cycle is prohibitive.

Programming with Reduced Verify

Reduced verify schemes for programming a nonvolatile memory have been disclosed in U.S. Pat. Nos. 7,643,348, 7,800,945 and 7,826,271. These schemes involve programming with a staircase waveform pulse by pulse and initially verifying between pulses for a cell relative to a checkpoint threshold value. Once the cell has programmed past the checkpoint, the programming continues without verifying and stops when the staircase waveform has reached a certain magnitude given as a predetermined function of the threshold increment from the checkpoint to the cell's target state. The disclosures of U.S. Pat. Nos. 7,643,348, 7,800,945 and 7,826,271 are incorporated herein by reference.

However, as the threshold of a cell under programming is advanced pulse by pulse to its target destination, reducing the number of verifying steps along the way means there is less control in the localization of the threshold at the target destination. This will result in a broadening of the threshold distribution for the various memory states.

Figure 11:
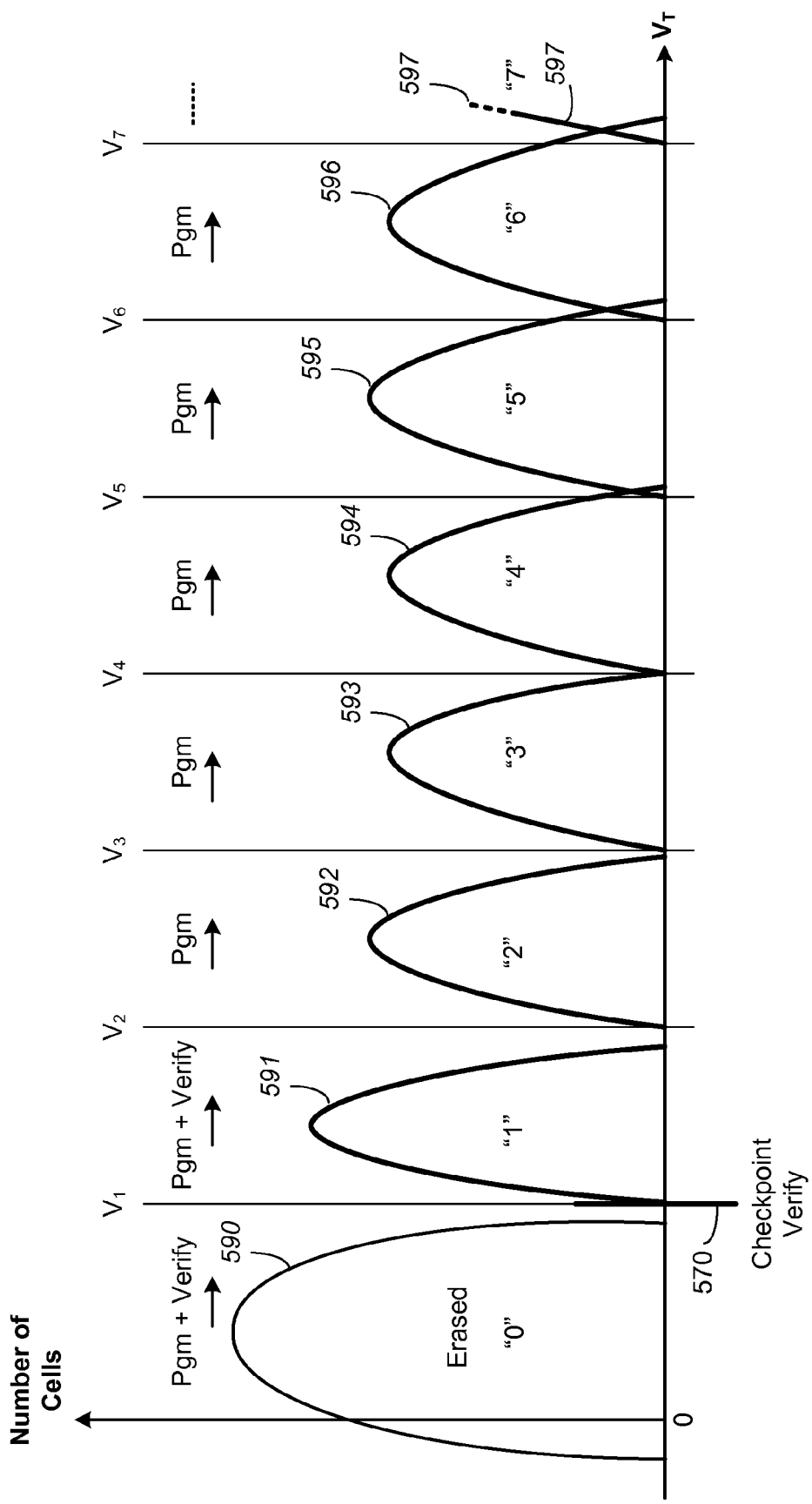
FIG. 11 illustrates schematically, the programming of an 8-state memory where there is only an initial verify at the first programmed state.

FIG. 11 illustrates schematically, the programming of an 8-state memory where there is only an initial verify at the first programmed state. The threshold window of each cell is partitioned into eight threshold ranges by seven demarcation threshold values, $V_1$ to $V_7$. A group of memory cells sharing the same word line is being programmed in parallel. Initially, after each program pulse, the cells in the group are being verified at a checkpoint threshold 570 chosen to be at $V_1$. Once verified at $V_1$, those cells with target state "1" are program-inhibited from further programming.

Once verified at $V_1$, for the other cells with target state higher than "1", the program pulse level at which each cell is verified at $V_1$ is noted. Once this baseline programming voltage level is determined for a cell, it is a matter of subjecting the cell to a predetermined number of additional program pulses from there to reach the cell's target state. The predetermined number of additional program pulses is a function of the distance from the memory state of $V_1$ to the target memory state. No verify steps in between pulses are required. For example, the programming of the cells with target state "2" will be subject to a predetermined number of additional program pulses after passing the checkpoint verify $V_1$ (e.g., one or two pulses) before they are inhibited from further programming. The programming of the cells with target state "3" will be subjected to another predetermined number of additional programming pulses after passing $V_1$ (e.g., two to four pulses) before all the memory cells of the group have completed programming.

Programming Voltage as a Pulse Train with Predetermined Step Size

In a preferred embodiment, the programming voltage step size is adjusted such that each additional pulse will program the memory cell to the next memory state. For example of a memory cell with 16 possible memory states, the pulse size may be 300 mV. In this way, one additional pulse will program the memory to State "2", another additional pulse will program the memory to State "3", etc. Thus, programming to a given memory state can be reduced to counting the number of states from State "1" and supplying the same number of pulses. For example, a flag may be set once in State "1" and thereafter the memory cell can be programmed by a number of pulses same as the number of states the target state is away from State "1".

Other programming pulse sizes are possible. For example, for the memory cell with 16 possible memory states, the pulse size may be 150 mV. In that case, it will take two pulses to program from one memory state to the next adjacent memory state. This will provide finer resolution in the programming, which is useful in implementations where a margin from the targeted threshold is employed.

FIG. 11 illustrates schematically a typical threshold distribution of an array of memory cells programmed with 3-bit data (among eight memory states) as represented by a population of cells being programmed to various threshold values within a threshold window. To clearly distinguish the various memory states, each of their individual threshold distributions 590, 591, 592, 593, 594, 595, 596, 597, should be confined within in its respective threshold range such as $<V_1$, $V_1$ to $V_2$, $V_2$ to $V_3$, ..., $>V_7$, etc. However, as explained before, with only one verify point at a checkpoint=$V_1$ at the beginning of the programming pass, the more programmed states, such as "2" to "7" are being programmed without a verify operation. This can result in a broadening of the threshold distribution to the extent its far-end tail end can spill over to the next threshold range and causing, for example, a "5" state to be read as a "6" state in error.

Programming with Tighter Threshold Distribution

A group of memory cells of a nonvolatile memory is programmed in parallel in a programming pass from an erased state to respective target states by a series of pulses of a staircase waveform. Conventionally, following each pulse, the memory cells are sensed relative to a verify threshold value. Whenever a cell is detected to change from a turned-on to a turned-off state, it is an indication that the cell's threshold has been programmed past the verify threshold value. The cell is considered programmed relative to the verify threshold value and programming for that cell is inhibited from then on. However, the amount of overshoot of the cell's threshold beyond the verify threshold value is unknown. In general the overshoot is a function of the cell's threshold relative position to the verify threshold value before the programming pulse and the strength or step size of the pulse. If a verify operation takes place after each pulse, the overshoot is kept in check. However, in programming schemes where verify operations are reduced or eliminated, and the cell's threshold may be advanced over multiple pulses without any intervening verify, the overshoot may compound, resulting in a widening of the programmed threshold distribution for the more programmed states.

According to a general embodiment of the invention, a group of memory cells of a nonvolatile memory is programmed in parallel in a programming pass from an erased state to respective target states by a staircase waveform. The memory cells each support a threshold window partitioned into a plurality of threshold subranges by a set of increasing demarcation threshold values ($V_1, \ldots, V_N$) so that each subrange represents a different memory state. During the initial stage of the programming pass, the memory cells are verified relative to a test reference threshold value. This test reference threshold has a value offset from a designate demarcation threshold value $V_i$ among the set by a predetermined margin. This provides a measure of the overshoot of each memory cell when programmed past $V_i$, i.e., whether the overshoot is more or less than the margin. Accordingly, memory cells found to have overshot more than the margin would end up with a threshold distribution at least as wide as the margin. Memory cells with this excessive overshoot are counteracted by having their programming rate slowed down in subsequent portion of the programming pass. The slowed down in programming rate will trim the far end of the threshold distribution as the cell is being programmed to higher programmed states. In this way, the memory cells will be programmed to individual memory states having relatively tighter threshold distributions, even if the subsequent portion of the programming pass is performed with little or no verifying in between programming pulses.

FIG. 12 is a threshold distribution of an 8-state memory obtained by programming and verifying relative to a test reference threshold value, according to one embodiment of the present invention. The threshold window of the 8-state memory is partitioned into eight subranges, which are demarcated by $V_1$ to $V_7$, similar to that shown in FIG. 11. A group of nonvolatile memory cells are being programmed in parallel. Prior to programming, the group of nonvolatile memory cells are first erased to an erased state "0", having an individual threshold distribution 590 below $V_1$.

The programming voltage being applied to the group of memory cells is similar to that shown in FIG. 8, except in the later portion of the programming pass, the verify steps are either omitted or reduced. It is a series of incremental voltage pulses that operate in a programming pass. As the programming voltage is applied pulse by pulse, the memory cells under programming will have their thresholds progressively programmed to higher and higher levels in the threshold window.

Similar to that illustrated in FIG. 11, at the beginning of the programming pass, after each program pulse, the memory cells are verified relative to a checkpoint threshold value 570 which preferably is chosen as one of the demarcation threshold values Vj (j=1 or 2 or 3 . . . ) The lowest demarcation threshold $V_1$ is chosen to allow a maximum of memory states to be programmed with reduced verify. As explained above, this establishes a baseline programming voltage level for programming cells with target states higher than "0" without the need for further verify steps. It should be clear to those skilled in the art that other demarcation thresholds, such as $V_2$, can be chosen or more than one checkpoints can be employed.

Also at the beginning of the programming pass, after each program pulse, the memory cells are also verified relative to the test reference threshold value 580. The test reference threshold value 580 is offset past one of the demarcation threshold values $V_i$ (i=1 or 2 or 3 . . . ) by a predetermined margin 581. Preferably, the margin 581 is such that the test reference threshold value is located midway in the threshold subrange demarcated by $V_i$ and $V_{i+1}$. Also the test reference threshold value 580 is greater than the checkpoint threshold value 570 with i≧j.

Thus, at a predetermined program pulse level when the memory cell is expected to have just programmed past $V_i$, verifying relative to the test reference threshold value 580 provides information about the programming state of the cell in the subrange demarcated by $V_i$ and $V_{i+1}$ (in the present case $V_1$ and $V_2$) according to one of three cases.

The first case is when the cell is not yet verified to the checkpoint 570. This means the cell's threshold has not yet programmed past $V_1$ and therefore not yet programmed to the "1" memory state. This cell will continue to be subjected to additional programming pulses.

The second case is when the cell is verified at the checkpoint 570 but not at the test reference threshold 580. This means the cell's threshold has programmed past the checkpoint 580 (e.g., $V_1$) and is therefore now programmed to the memory state "1". If the cell's target state is "1", it will be inhibited from further programming. The cell's threshold is a member of the threshold distribution 591.

If the cell's target state is greater than "1" it will continue to be subjected to additional programming pulses. However, the strength of the additional programming may be adjusted depending on when the cell was verified at $V_1$, and whether it was also verified at the test reference 580. Since in this second case, it was not also verified at the test reference 580 (or $V_1$+margin 581), the cell's threshold has programmed past $V_1$ with an overshoot less than the margin 581. The additional programming may then proceed normally without any adjustments. In the preferred embodiment, the cell is programmed to its target state by a predetermined number of additional programming pulses dependent on the target state, without intervening verify steps. The cell is then inhibited from further programming after reaching its target state. Similar to that shown in FIG. 12, the cell's threshold is a member of one of the individual threshold distributions 592 to 597 depending respectively on the cell's target state being "2" to "7".

The third case is when the cell is verified both at V1 and the test reference threshold value 580. This means the cell's threshold has programmed past $V_1$ and also past the test reference threshold value 580. Thus, the overshoot from $V_1$ is greater than the margin 581. This means the threshold of this cell is at the far end of a threshold distribution well beyond $V_1$.

If the cell has a target state higher than what is currently verified at (i.e., a target state greater than "1") it will be subjected to further programming and with every additional program pulse, its threshold will increase and move further to the right of the threshold window. If it is at the far end of the individual threshold distribution when passing the first demarcation threshold $V_1$, it will also end up being at the far end of the individual threshold distribution when programmed to the target state. The rate of increase of a cell's threshold versus the number of pulses may be slightly non-linear that the far-end threshold may diverge even more after a few additional program pulses if unchecked by intervening verify steps. Thus, for this third case, the additional programming is then proceed with adjustments to reduce the rate of programming. As in case two, the cell is preferably programmed to its target state by a predetermined number of additional programming pulses (with reduced programming rate) dependent on the target state, with reduced or no intervening verify steps. The cell is then inhibited from further programming after it has reached its target state.

Thus, by verifying also at the test reference threshold value 580, which is situated in the middle of a threshold subrange, those cells detected to have thresholds in the far end of an individual threshold distribution will be subjected to a reduced programming rate in the subsequent portion of the programming pass. This will help trim the far end of the individual threshold to make it narrower. For example, FIG. 12 illustrates for the "2" state to have a trimmed individual threshold distribution 592', which is narrower than if the programming were performed normally to produce the untrimmed individual threshold distribution 592. The "3" state has a trimmed individual threshold distribution 593', which is narrower than if the programming were performed normally to provide the untrimmed individual threshold distribution 593. Similarly, the "4" to "7" states respectively has trimmed individual threshold distributions 594' to 597', which are narrower than if the programming were performed normally to provide respectively the untrimmed individual threshold distributions 594 to 597.

A general way of slowing down the programming rate is to reduce the effective programming voltage. As described earlier, one implementation of reducing the effective programming voltage is to raise the voltage on the channel region of the cell. This effectively reduces the electric field strength that pulls the electrons to tunnel from the channel region to the floating gate.

In one embodiment, a word line is provided to access in parallel the group of memory cells so that programming to the group is effected by applying the programming voltage to the word line. Also respective bit lines are provided to access individual memory cells of the group, and any memory cell that needs to have its programming rate reduced can be accomplished by raising by a predetermined voltage on a respective bit line of said any memory cell during said programming.

FIG. 13 is a threshold distribution of an 8-state memory obtained by programming and verifying relative to a test reference threshold according to another embodiment of the present invention. Essentially, this embodiment differs from that illustrated in FIG. 12 in that the test reference threshold value 580 is not located within the same threshold subrange as the checkpoint 570. In this embodiment, the test reference threshold value 580 is located midway between $V_2$ and $V_3$, which are the demarcation threshold values demarcating the individual threshold distribution 592 for state "2".

The concept of overshoot described earlier in connection with FIG. 12 is still applicable, except the overshoot is now with respect to the demarcation value $V_2$. The margin 581 is thus defined with respect to $V_2$. In the same vein, if the test threshold reference was in the threshold subrange for state "3", the margin 581 will be defined with respect to $V_3$, etc.

When the test reference threshold value is placed in the higher state, the higher state distributions can be tightened even better. The tradeoff is that the tightening benefits also come in later since the states before the verify relative to the test reference threshold can not get any tightening benefit. For example, it has been found that for a 6-state memory, the test reference threshold value is optimally in the "2" state.

FIG. 14 is a flow diagram illustrating setting a programming voltage with step size such that each additional pulse will program a memory cell to the next memory state.

Step 600:
Providing memory cells with a threshold window partitioned into a plurality of threshold subranges by a set of increasing demarcation threshold values $(V_1, \ldots, V_N)$ so that each subrange represents a different memory state. Proceed to STEP 610.

Step 610:
Applying a programming voltage as a series of incrementing voltage pulses in a programming pass to program in parallel memory cells of a group from an erased memory state to respective target memory states. Proceed to STEP 620.

Step 620:
Providing a test reference threshold having a value offset from a designate demarcation threshold value Vi among the set by a predetermined margin, so that when a memory cell is expected to have programmed past Vi but has not verified relative to the test reference threshold value, the memory cell will have a threshold with an overshoot past Vi within the predetermined margin, and when the memory cell is expected to have programmed past Vi and has also verified relative to the test reference threshold value, the memory cell will have a threshold with an overshoot past Vi more than the predetermined margin. Proceed to STEP 630.

Step 630:
Verifying memory cells of the group under programming relative to the test reference threshold value in between voltage pulses until the overshoot of each memory cell under programming is determined. Proceed to STEP 640.

Step 640:
Subsequently in the programming pass, slowing a rate of programming of any memory cell under programming that was determined to have an overshoot more than the margin. Proceed to STEP 650.

Step 650:
END.

The advantage of the present invention is that a nonvolatile memory can be programmed with a tighter threshold distribution even in high performance programming scheme in which verify operation is reduced.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. A method of programming in parallel a group of memory cells of a nonvolatile memory, comprising:
   providing the memory cells with a threshold window partitioned into a plurality of threshold subranges by a set of increasing demarcation threshold values $(V_1, V_2, \ldots, V_N)$ so that each subrange represents a different memory state;
   applying a programming voltage as a series of incrementing voltage pulses in a programming pass to program in parallel memory cells of the group from an erased memory state to respective target memory states;
   providing a test reference threshold having a value offset from a designate demarcation threshold value $V_i$ among the set by a predetermined margin, so that when a memory cell is expected to have programmed past $V_i$ but has not verified relative to the test reference threshold value, the memory cell will have a threshold with an overshoot past $V_i$ within the predetermined margin, and when the memory cell is expected to have programmed past $V_i$ and has also verified relative to the test reference threshold value, the memory cell will have a threshold with an overshoot past $V_i$ more than the predetermined margin;
   verifying the memory cells of the group under programming relative to the test reference threshold value in between voltage pulses until the overshoot of each memory cell under programming is determined; and in a subsequent portion of the programming pass, slowing a rate of programming of any memory cell under programming that was determined to have an overshoot more than the margin.

2. The method as in claim 1, wherein i=1.

3. The method as in claim 1, wherein i=2.

4. The method as in claim 1, further comprising:

identifying the program pulse at which each memory cell of the group under programming is verified at $V_j$; and in the subsequent portion of the programming pass, applying a predetermined number of additional program pulses from the identified program pulse to respective memory cell of the group under programming to program the respective memory cell to a respective target state, the predetermined number additional program pulses being a function of the identified program pulse and the respective target state.

5. The method as in claim 4, wherein j=1 and i≧j.

6. The method as in claim 1, further comprising:

providing a word line to access in parallel the group of memory cells;

providing respective bit lines to access individual memory cells of the group; and wherein:

said programming is effected by applying a programming voltage to the word line; and said slowing a rate of programming of said any memory cell includes raising a predetermined voltage on a respective bit line of said any memory cell during said programming.

7. The method as in claim 1, wherein:

the predetermined margin is half the width of the threshold subrange containing the test reference threshold value.

8. The method as in claim 1, wherein:

in the subsequent portion of the programming pass, a memory cell under programming is inhibited from further programming once the programming voltage has incremented to a value estimated to program the memory cell to a target state.

9. The method as in claim 1, wherein:

the subsequent portion of the programming pass is performed without verifying in between program pulses.

10. The method as in claim 1, wherein:

the subsequent portion of the programming pass is performed without verifying in between every program pulses.

11. A nonvolatile memory, comprising:

memory cells with a threshold window partitioned into a plurality of threshold subranges by a set of increasing verify threshold values ($V_1, V_2, \ldots, V_N$) so that each subrange represents a different memory state;

test reference threshold having a value offset from a designate demarcation threshold value $V_i$ among the set by a predetermined margin, so that when a memory cell is expected to have programmed past $V_i$ but has not verified relative to the test reference threshold value, the memory cell will have a threshold with an overshoot past $V_i$ within the predetermined margin, and when the memory cell is expected to have programmed past $V_i$ and has also verified relative to the test reference threshold value, the memory cell will have a threshold with an overshoot past $V_i$ more than the predetermined margin;

read/write circuits for programming and verifying a group of memory cells in parallel;

said read/write circuits having operations including:

applying a programming voltage as a series of incrementing voltage pulses in a programming pass to program in parallel memory cells of the group from an erased memory state to respective target memory states;

verifying the memory cells of the group under programming relative to the test reference threshold value in between voltage pulses until the overshoot of each memory cell under programming is determined; and in a subsequent portion of the programming pass, slowing a rate of programming of any memory cell under programming that was determined to have an overshoot more than the margin.

12. The nonvolatile memory as in claim 11, wherein i=1.

13. The nonvolatile memory as in claim 11, wherein i=2.

14. The nonvolatile memory as in claim 11, wherein said read/write circuits have operations further comprising:

identifying the program pulse at which each memory cell of the group under programming is verified at $V_j$; and in the subsequent portion of the programming pass, applying a predetermined number of additional program pulses from the identified program pulse to respective memory cell of the group under programming to program the respective memory cell to a respective target state, the predetermined number additional program pulses being a function of the identified program pulse and the respective target state.

15. The nonvolatile memory as in claim 14, wherein j=1 and i≧j.

16. The nonvolatile memory as in claim 11, further comprising:

a word line to access in parallel the group of memory cells;

respective bit lines to access individual memory cells of the group; and wherein:

said programming is effected by applying a programming voltage to the word line; and said slowing a rate of programming of said any memory cell includes raising a predetermined voltage on a respective bit line of said any memory cell during said programming.

17. The nonvolatile memory as in claim 11, wherein:

the predetermined margin is half the width of the threshold subrange containing the test reference threshold value.

18. The nonvolatile memory as in claim 11, wherein:

in the subsequent portion of the programming pass, a memory cell under programming is inhibited from further programming once the programming voltage has incremented to a value estimated to program the memory cell to a target state.

19. The nonvolatile memory as in claim 11, wherein:

the subsequent portion of the programming pass is performed without verifying in between program pulses.

20. The nonvolatile memory as in claim 11, wherein:

the subsequent portion of the programming pass is performed without verifying in between every program pulses.

* * * * *